(12) United States Patent
Chung

(10) Patent No.: US 8,299,982 B2
(45) Date of Patent: Oct. 30, 2012

(54) EMISSION CONTROL LINE DRIVER AND ORGANIC LIGHT EMITTING DISPLAY USING THE EMISSION CONTROL LINE DRIVER

(75) Inventor: Bo Yong Chung, Seoul (KR)

(73) Assignee: Samsung Display Co., Ltd., Gyeonggi-Do (KR)

( * ) Notice: Subject to any disclaimer, the term of this patent is extended or adjusted under 35 U.S.C. 154(b) by 887 days.

(21) Appl. No.: 11/520,068

(22) Filed: Sep. 12, 2006

(65) Prior Publication Data

US 2007/0063933 A1 Mar. 22, 2007

(30) Foreign Application Priority Data

Sep. 13, 2005 (KR) .................. 10-2005-0085414

(51) Int. Cl.
 *G09G 3/30* (2006.01)
(52) U.S. Cl. ............................ 345/76; 345/82
(58) Field of Classification Search ............... 345/76–83
 See application file for complete search history.

(56) References Cited

U.S. PATENT DOCUMENTS

| 5,633,653 | A | 5/1997 | Atherton | |
|---|---|---|---|---|
| 6,339,631 | B1* | 1/2002 | Yeo et al. | 377/64 |
| 6,777,712 | B2 | 8/2004 | Sanford et al. | |
| 2003/0128180 | A1* | 7/2003 | Kim et al. | 345/100 |
| 2004/0164978 | A1 | 8/2004 | Shin et al. | |
| 2004/0174189 | A1 | 9/2004 | Nagao et al. | |
| 2005/0008114 | A1* | 1/2005 | Moon | 377/64 |
| 2005/0018807 | A1* | 1/2005 | Han et al. | 377/69 |
| 2005/0036581 | A1 | 2/2005 | Lin | |
| 2005/0220263 | A1* | 10/2005 | Moon | 377/68 |
| 2005/0264493 | A1* | 12/2005 | Shin | 345/76 |
| 2005/0264505 | A1* | 12/2005 | Kim | 345/87 |
| 2005/0285827 | A1* | 12/2005 | Eom | 345/76 |
| 2006/0007085 | A1* | 1/2006 | Kim et al. | 345/87 |
| 2006/0071888 | A1* | 4/2006 | Lee et al. | 345/82 |

FOREIGN PATENT DOCUMENTS

| JP | 2003-263128 | 9/2003 |
|---|---|---|
| KR | 1020050001741 A | 1/2005 |
| WO | WO 2005/122178 A1 | 12/2005 |

OTHER PUBLICATIONS

The Extended European Search Report for EP 06254758.3 dated Feb. 3, 2009.
European Office Communication dated Dec. 6, 2010 of European Patent Application No. EP 06 254 758.3 claiming priority of Korean Patent Application No. KR 10-2005-0085414 which corresponds to the captioned application.

* cited by examiner

*Primary Examiner* — Chanh Nguyen
*Assistant Examiner* — Robert Stone
(74) *Attorney, Agent, or Firm* — Knobbe Martens Olson & Bear, LLP

(57) ABSTRACT

An emission control line driver capable of being mounted on a panel, of improving driving speed, and of minimizing power consumption. The emission control line driver includes stage circuits each having clock, inverted clock, and start pulse inputs and each generating an emission control signal pulse. The stage circuits are cascaded to provide a series of emission control signals.

25 Claims, 8 Drawing Sheets

EMISSION CONTROL LINE DRIVER AND ORGANIC LIGHT EMITTING DISPLAY USING THE EMISSION CONTROL LINE DRIVER

CROSS-REFERENCE TO RELATED APPLICATIONS

This application claims the benefit of Korean Patent Application No. 2005-0085414, filed on Sep. 13, 2005, in the Korean Intellectual Property Office, the disclosure of which is incorporated herein by reference.

BACKGROUND OF THE INVENTION

1. Field of the Invention

The invention relates to organic light emitting displays and more particularly to an emission control line driver for use in an organic light emitting display, the driver capable of being mounted on a panel, of improving display driving speed, and of minimizing display power consumption.

2. Description of the Related Technology

Recently, various flat panel displays (FPDs) have been developed, having reduced weight and volume when compared to cathode ray tubes (CRTs). The FPDs include liquid crystal displays (LCD), field emission displays (FED), plasma display panels (PDP), and organic light emitting displays.

Among the FPDs, the organic light emitting displays display images using organic light emitting diodes (OLED) that generate light as a result of the re-combination of electrons and holes. The organic light emitting display has high response speed and is driven with low power consumption. A common organic light emitting display supplies currents corresponding to data signals to an array of OLEDs using transistors formed in pixel circuits such that light is generated by the OLEDs.

A conventional organic light emitting display includes a data driver for supplying data signals to data lines, a scan driver for sequentially supplying scan signals to scan lines, an emission control line driver for supplying emission control signals to emission control lines, and a pixel array including a plurality of pixels connected to the data lines, the scan lines, and the emission control lines.

The pixels included in the pixel array are selected when the scan signals are supplied to the scan lines and in response, the selected pixels receive the data signals from the data lines. The pixels that received the data signals generate light components of predetermined brightness corresponding to the data signals so as to display images. The emission duration of the pixels is controlled by the emission control signals supplied from the emission control lines.

In general, the emission control signals set the pixels into a non-emitting state during a period when the data signals are supplied to the pixels. Also, the emission control signal supplied to a previous emission control line and the emission control signal supplied to a current emission control line are supplied so as to overlap each other for a certain duration of time.

In addition to increased performance, the typically corresponding increase in display light weight and manufacturing cost is avoided by mounting the device on a panel. However, because the conventional emission control line driver is formed of a PMOS transistor and an NMOS transistor, the conventional emission control line driver cannot be easily mounted on the panel. Also, because the conventional emission control line driver generates an output signal every one or more periods of a clock signal, the conventional emission control line driver cannot be easily driven at high speed. In addition, because a certain static current flows through the conventional emission control line driver formed of the PMOS transistor and the NMOS transistor when the output signals are generated, a large amount of power is consumed in operation of the display.

SUMMARY

Accordingly, an emission control line driver capable of being mounted on a panel, of improving driving speed, and of minimizing power consumption is presented. Also presented is an organic light emitting display using the emission control line driver.

One embodiment is an emission control line driver configured to receive first and second clock signals and inverted first and inverted second clock signals. The emission control line driver includes a plurality of stages, each stage configured to receive one of the first and second clock signals and one of an inverted first clock signal and an inverted second clock signal, the emission control line driver also including a first stage including first and second clock inputs, the first and second clock inputs configured to receive the first clock signal, and a third clock input, the third clock input configured to receive the inverted first clock signal, a second stage including fourth and fifth clock inputs, the fourth and fifth clock inputs configured to receive the second clock signal, and a sixth clock input, the sixth clock input configured to receive the inverted second clock signal, a third stage including seventh and eighth clock inputs, the seventh and eighth clock inputs configured to receive the inverted first clock signal, and a ninth clock input, the ninth clock input configured to receive the inverted first clock signal, and a fourth stage including tenth and eleventh clock inputs, the tenth and eleventh clock inputs configured to receive the inverted second clock signal, and a twelfth clock input, the twelfth clock input configured to receive the inverted second clock signal.

Another embodiment is a organic light emitting display including a pixel portion having a plurality of pixels connected to a plurality of emission control lines, a plurality of scan lines, and a plurality of data lines, a scan driver configured to drive the scan lines, a data driver configured to drive the data lines, and an emission control line driver configured to supply emission control signals to the emission control lines. The emission control line driver includes a first stage including first and second clock inputs, the first and second clock inputs configured to receive the first clock signal. The display also includes a third clock input, the third clock input configured to receive the inverted first clock signal, a second stage including fourth and fifth clock inputs, the fourth and fifth clock inputs configured to receive the second clock signal, and a sixth clock input, the sixth clock input configured to receive the inverted second clock signal, a third stage including seventh and eighth clock inputs, the seventh and eighth clock inputs configured to receive the inverted first clock signal, and a ninth clock input, the ninth clock input configured to receive the inverted first clock signal, and a fourth stage including tenth and eleventh clock inputs, the tenth and eleventh clock inputs configured to receive the inverted second clock signal, and a twelfth clock input, the twelfth clock input configured to receive the inverted second clock signal.

Another embodiment is a control signal driving circuit configured to provide a control signal pulse substantially aligned with a clock input signal, where the control signal pulse is provided in response to a start pulse input signal, the circuit including transistors of a single conductivity type.

Another embodiment is a control signal driving circuit configured to provide a control signal pulse substantially aligned with a clock input signal, where the control signal pulse is provided in response to a start pulse input signal, the circuit including means for generating a single pulse substantially aligned with the clock input signal, where the single pulse is provided in response to a start pulse input signal, and means for generating the control signal pulse, where the control signal pulse is an inverted version of the single pulse.

BRIEF DESCRIPTION OF THE DRAWINGS

These and/or other objects and advantages will become apparent and more readily appreciated from the following description, taken in conjunction with the accompanying drawings, of which.

DETAILED DESCRIPTION OF CERTAIN ASPECTS

Hereinafter, embodiments will be described with reference to the accompanying drawings, that is, FIGS. 1 to 9.

Figure 1:
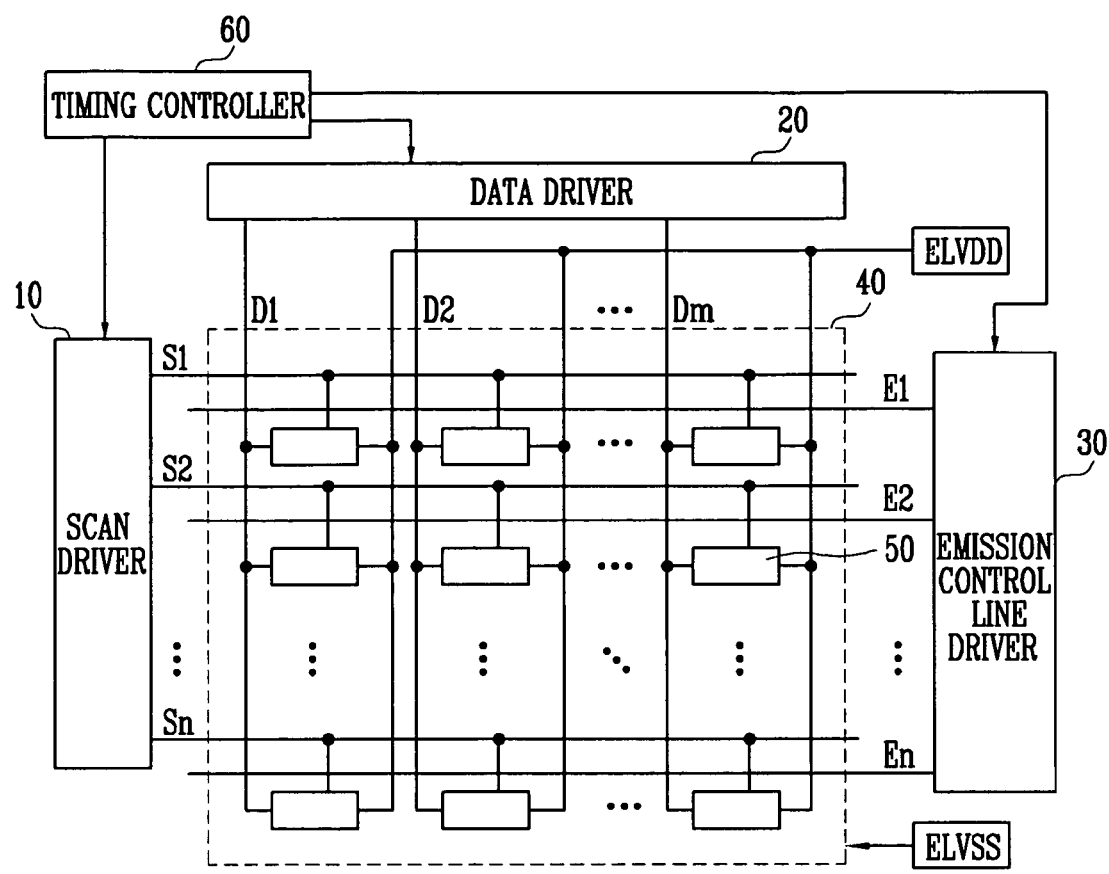
FIG. 1 illustrates an embodiment of an organic light emitting display.

FIG. 1 illustrates an embodiment of an organic light emitting display. Referring to FIG. 1, a scan driver 10 and an emission control line driver 30 are separate circuit elements. However, in some embodiments the emission control line driver 30 may be integrated with the scan driver 10.

Referring to FIG. 1, the organic light emitting display according to one embodiment includes a pixel portion 40 having a plurality of pixels 50 connected to scan lines S1 to Sn, data lines D1 to Dm, and emission control lines E1 to En. The display also includes the scan driver 10 configured to drive the scan lines S1 to Sn, a data driver 20 configured to drive the data lines D1 to Dm, the emission control line driver 30 configured to drive the emission control lines E1 to En, and a timing controller 60 configured to control the scan driver 10, the data driver 20, and the emission control signal driver 30.

The scan driver 10 is controlled by the timing controller 60 such that scan driver 10 sequentially supplies the scan signals to the scan lines S1 to Sn. Accordingly, the pixels 50 connected to the scan lines S1 to Sn are sequentially selected.

The data driver 20 is controlled by the timing controller 60 so as to supply data signals to the data lines D1 to Dm during periods when the scan signals are supplied. Consequently, the data signals are supplied to the pixels 50 selected by the scan signals and the selected pixels 50 charge voltages corresponding to the data signals supplied thereto.

The emission control line driver 30 is controlled by the timing controller 60 so as to sequentially supply the emission control signals to the emission control lines E1 to En. The emission control line driver 30 supplies the emission control signals so that the pixels 50 do not emit light while the data signals are supplied to the pixels 50 and so that the pixels 50 do emit light otherwise. The emission control line driver 30 supplies the emission control signals so that the emission control signal supplied to a jth (j is a positive integer) the emission control line Ej and the emission control signal supplied to a (j+1)th emission control line Ej+1 at least partially overlap.

Figure 2:
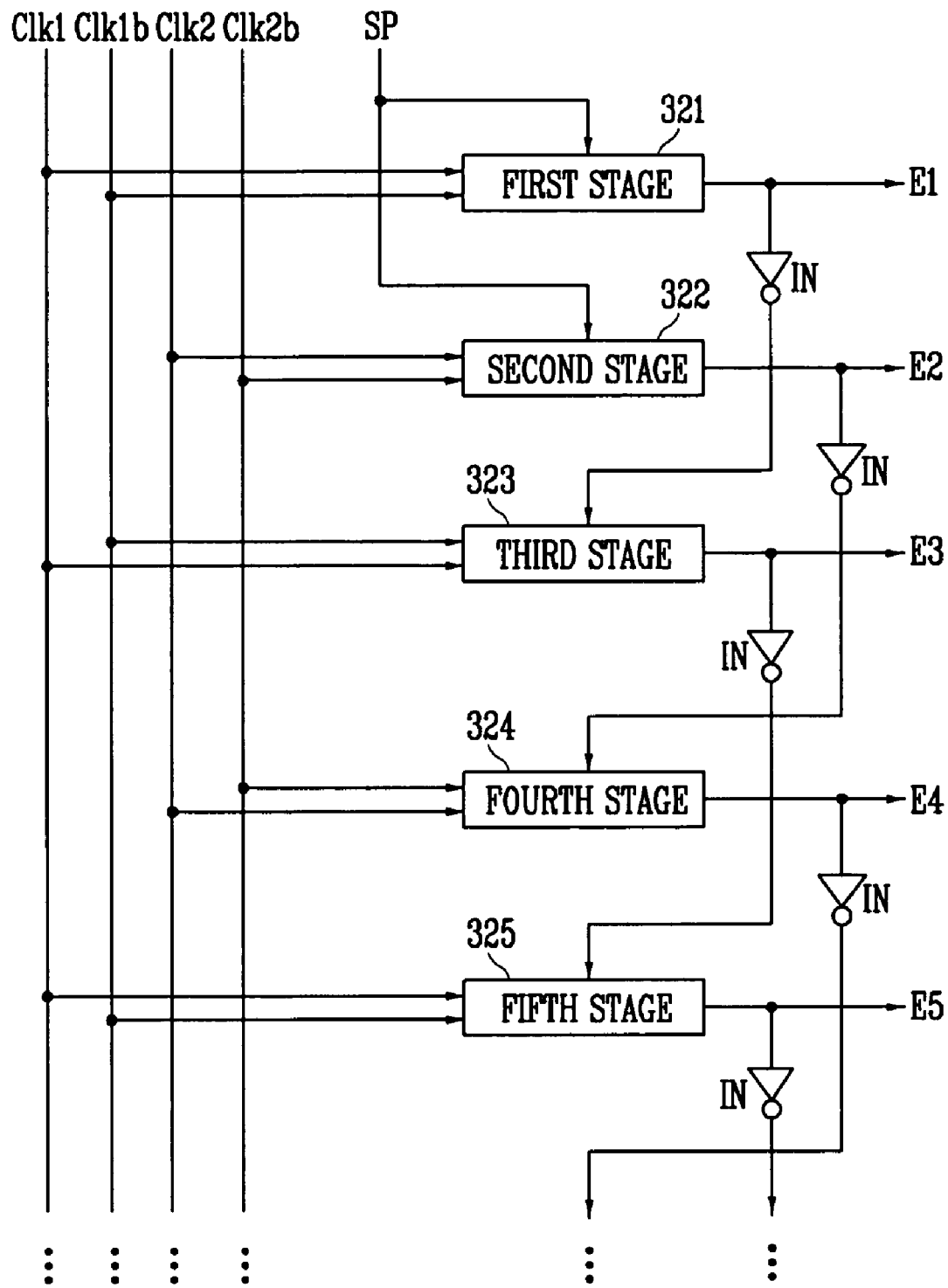
FIG. 2 schematically illustrates the emission control line driver illustrated as part of the organic light emitting display of FIG. 1.

FIG. 2 schematically illustrates the emission control line driver illustrated as part of the organic light emitting display of FIG. 1;

Referring to FIG. 2, the emission control line driver according to some embodiments includes n stages 321, 322, 323, 324, 325, . . . configured to supply the emission control signals to the n emission control lines E1 to En. The stages 321, 322, 323, 324, 325, . . . are connected to the emission control lines E and are driven by two clock signals.

In this embodiment, the timing controller 60 supplies four clock signals Clk1, Clk1b, Clk2, and Clk2b and a start signal SP to the emission control line driver 30. The first clock signal Clk1 and the inverted first clock signal Clk1b are supplied to the odd stages 321, 323, 325, . . . and the second clock signal Clk2 and the inverted second clock signal Clk2b are supplied to the even stages 322, 324, . . . . The start signal SP is supplied to the first stage 321 and the second stage 322. The first clock signal Clk1 and the second clock signal Clk2 have the same period and are supplied so that the high level (or low level) of the first clock signal Clk1 and the high level (or low level) of the second clock signal Clk2 overlap each other by about ¼ period, and accordingly are about 90 degrees out of phase.

The inverted output of an i th stage 32i (i is a positive integer) is supplied to an (i+2)th stage 32i+2 via an inverter IN1. That is, the inverted output of the first stage 321 is supplied to the third stage 323 via the inverter IN1 and the inverted output of the third stage 323 is supplied to the fifth stage 325 via the inverter IN3. That is, each of the odd stages 323, 325, . . . receives the inverted output of the previous odd stage. Similarly, the inverted output of the second stage 322 is supplied to the fourth stage 324 via the inverter IN2 and the inverted output of the fourth stage 324 is supplied to the sixth stage via the inverter IN4. That is, each of the even stages 324, . . . receives the inverted output of the previous even stage.

As described above, the stages 321, 322, 323, 324, 325, . . . included in the emission control line driver 30 are divided into the odd stages and the even stages. The stages 321, 322, 323, 324, 325, . . . are driven by the two clock signals among the four clock signals supplied from the outside. That is, each of the clock signals is supplied to half of the stages in the emission control line driver 30. Accordingly, because the clock signals are supplied to only a portion of the stages included in the emission control line driver 30, the load for each clock driving circuit in the timing controller is reduced. For example, the load of the clock signals of this embodiment is reduced to about ½ the load for the case in which the clock signals are supplied to all of the stages.

FIG. 2 also shows that the clock inputs of every other odd stage are connected to the first clock signal Clk1 and the inverted first clock signal Clk1b in the same arrangement, while clock inputs of the other odd stages are connected to the first clock signal Clk1 and the inverted first clock signal Clk1b in the opposite arrangement. For example, the first and second clock inputs of the first stage 321 and the fifth stage 325 are each connected to the first clock signal Clk1 and the third clock inputs of the first stage 321 and the fifth stage 325 are each connected to the inverted first clock signal Clk1b. However, the first and second clock input of the third stage 323 is connected to the inverted first clock signal Clk1b and the third clock input of the third stage 323 is connected to the first clock signal Clk1. As shown in FIG. 2 the clock inputs of the even stages are similarly arranged with respect to the second clock signal Clk2 and the inverted second clock signal Clk2b.

Figure 3:
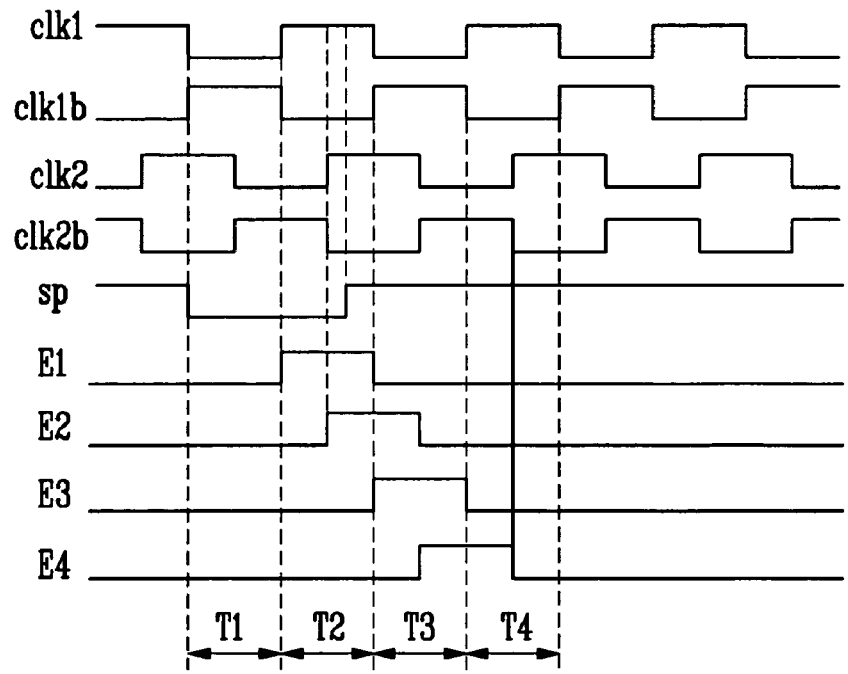
FIG. 3 is a timing diagram illustrating waveforms used to drive the stages of the display illustrated in FIG. 2.

The emission control line driver 30 according to one embodiment outputs an emission control signal every ¼ period of each of the clock signals as illustrated in FIG. 3. Also, as illustrated in FIG. 3, two emission control signals are output while the first clock signal Clk1 maintains a high level and two emission control signals are output while the first clock signal Clk1 maintains a low level. As described above, when the emission control signal is output every ¼ period of each of the clock signals, the emission control line driver 30 may be driven at high speed.

Figure 4:
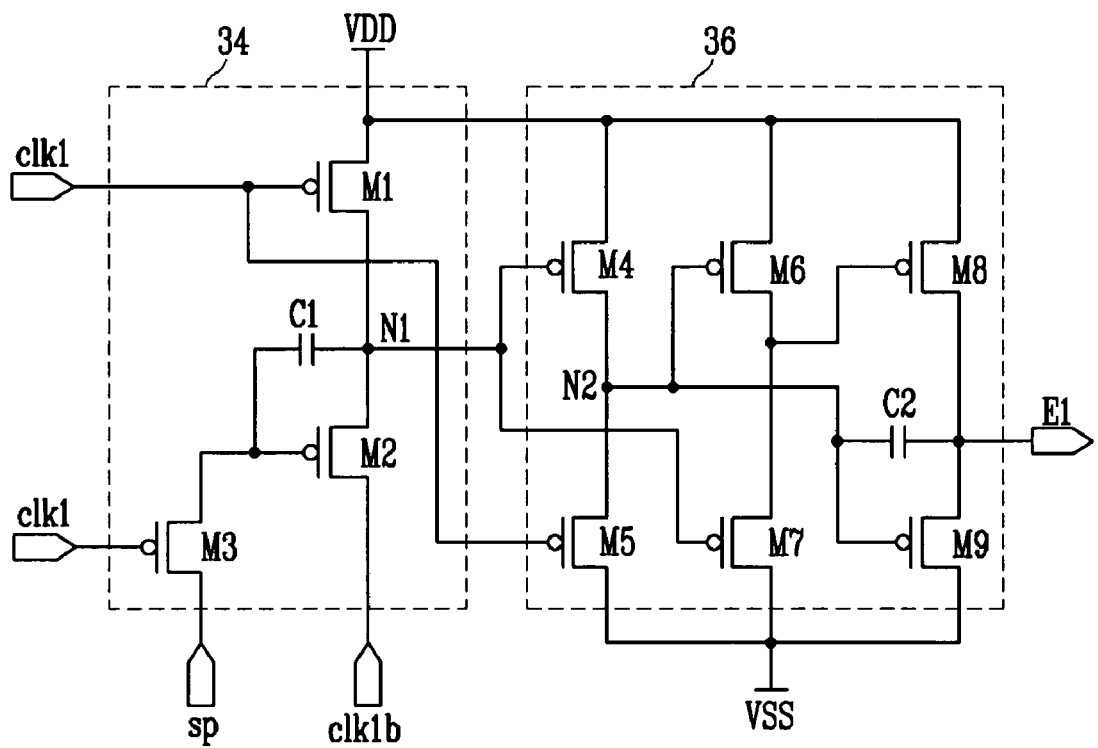
FIG. 4 is a circuit diagram illustrating a circuit included in a stage of the display illustrated in FIG. 2.

FIG. 4 illustrates the internal circuit of an embodiment of each stage. In FIG. 4, for convenience sake, the first stage 321 connected to the first clock signal Clk1 and the inverted first clock signal Clk1b is illustrated.

Referring to FIG. 4, the first stage 321 according to this embodiment includes an input unit 34 configured to generate a first signal on first node N1 in response to the clock signals Clk1 and Clk1b and the start signal SP. The first stage 321 also includes an output unit 36 configured to generate the emission control signal in response to the first signal and the first clock signal Clk1.

As shown in FIG. 4 the input unit 34 includes a first transistor M1 connected to a first power source VDD and the first input terminal, a third transistor M3 connected to the second input terminal and the fourth input terminal, a second transistor M2 connected to the third transistor M3 and the third input terminal, and a first capacitor C1 connected between the gate electrode of the second transistor M2 and a first electrode (a source electrode).

The first electrode of the first transistor M1 is connected to the first power source VDD and the gate electrode of the first transistor M1 is connected to the first input terminal. Another embodiment is a second electrode (a drain electrode) of the first transistor M1 is connected to the first node N1. The first transistor M1 is turned on when the first clock signal Clk1 is supplied to the first input terminal. In response, the first transistor M1 supplies the voltage of the first power source VDD to the first node N1.

The first electrode of the second transistor M2 is connected to the first node N1 and the second electrode of the second transistor M2 is connected to the third input terminal. The gate electrode of the second transistor M2 is connected to the first electrode of the third transistor M3. The second transistor M2 is turned on or off according to the voltage charged in the first capacitor C1. The third input terminal receives the inverted first clock signal Clk1b.

The first electrode of the third transistor M3 is connected to the gate electrode of the second transistor M2 and the second electrode of the third transistor M3 is connected to the fourth input terminal SP. The gate electrode of the third transistor M3 is connected to the second input terminal Clk1. The third transistor M3 is turned on when the first clock signal Clk1 is supplied to the second input terminal.

The first capacitor C1 is connected between the gate electrode and the first electrode of the second transistor M2. The first capacitor C1 stores a voltage that turns on the second transistor M2 when a low start signal SP is supplied to the fourth input terminal and does not charge a voltage otherwise.

The output unit 36 outputs a high emission control signal when the first signal having a low level is applied to the first node N1 and outputs a low emission control signal otherwise (that is, when the first signal having a high level is supplied to the first node N1).

As shown in FIG. 4, the output unit 36 includes a fourth transistor M4, a sixth transistor M6, and an eighth transistor M8, a fifth transistor M5, a seventh transistor M7, and a ninth transistor M9. The output unit 36 also includes a second capacitor C2, which is connected between the gate electrode and the first electrode of the ninth transistor M9.

The first electrode of the fourth transistor M4 is connected to the first power source VDD and the second electrode of the fourth transistor M4 is connected to a second node N2. The gate electrode of the fourth transistor M4 is connected to the first node N1.

The first electrode of the fifth transistor M5 is connected to the second node N2 and the second electrode of the fifth transistor M5 is connected to the second power source VSS. The gate electrode of the fifth transistor M5 receives the first clock signal Clk1.

The first electrode of the sixth transistor M6 is connected to the first power source VDD and the second electrode of the sixth transistor M6 is connected to the first electrode of the seventh transistor M7. The gate electrode of the sixth transistor M6 is connected to the second node N2.

The first electrode of the seventh transistor M7 is connected to the second electrode of the sixth transistor M6 and the second electrode of the seventh transistor M7 is connected to the second power source VSS. The gate electrode of the seventh transistor M7 is connected to the first node N1.

The first electrode of the eighth transistor M8 is connected to the first power source VDD and the second electrode of the eighth transistor M8 is connected to the emission control line E. The gate electrode of the eighth transistor M8 is connected to the second electrode of the sixth transistor M6.

The first electrode of the ninth transistor M9 is connected to the emission control line E and the second electrode of the ninth transistor M9 is connected to the second power source VSS. The gate electrode of the ninth transistor M9 is connected to the second node N2.

The second capacitor C2 is connected between the gate electrode and the first electrode of the ninth transistor M9. The second capacitor C2 affects the turn on and off of the ninth transistor M9.

Operation of the stage circuit shown in FIG. 4 will be described in detail with reference to FIGS. 3 and 4. First, the first clock signal Clk1 is set to be in the low level and the inverted first clock signal Clk1b is set to be in the high level in a first period T1.

Figure 5A:
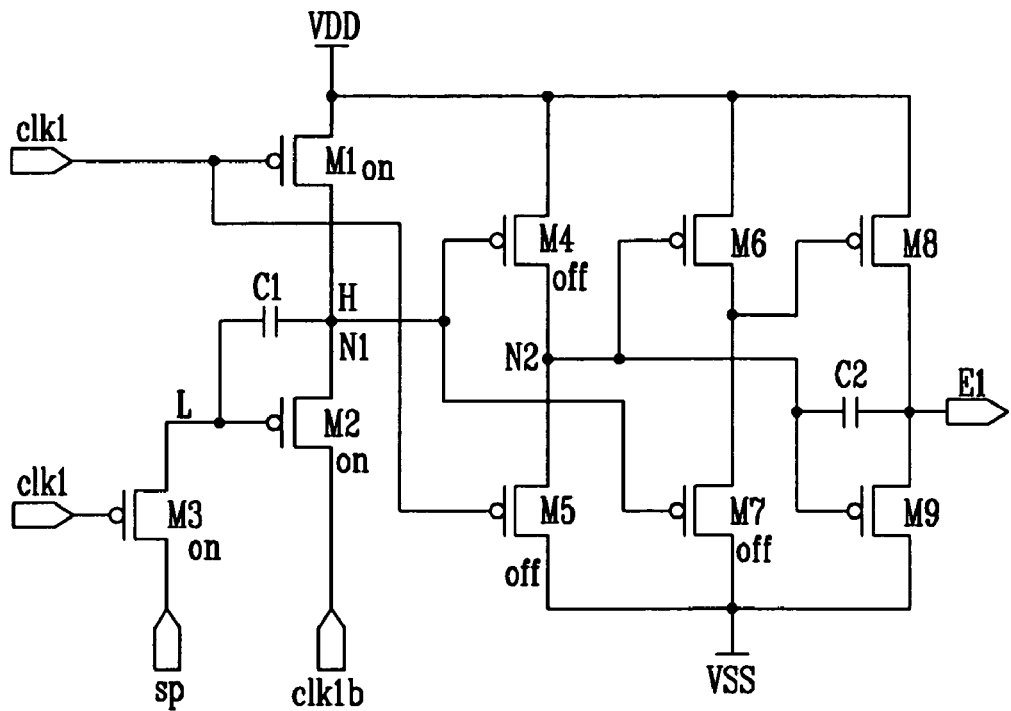
FIGS. 5A to 5D are circuit diagrams illustrating processes of driving the circuit illustrated in FIG. 4.

During the first period T1, as illustrated in FIG. 5A, the first transistor M1 is turned on by the first clock signal Clk1 and the third transistor M3 is turned on by the first clock signal Clk1.

When the first transistor M1 is turned on, the voltage level of the first node N1 becomes the voltage level of the first power source VDD. That is, the voltage of the first signal is in the high level and is applied to the first node N1. When the third transistor M3 is on, the voltage level of the gate electrode of the second transistor M2 becomes the low level because the start signal SP is low during the first period T1, as shown in FIG. 4. In response, the first capacitor C1 stores a voltage corresponding to the difference between the voltage of the first power source VDD applied to the first node N1 and the voltage in the low level applied to the gate electrode of the second transistor M2. Here, the voltage in the low level of the start signal SP may be set to the voltage of the second power source VSS, which is lower than the voltage of the first power source VDD.

During the first period T1, as shown in FIG. 5A, the voltage of the inverted first clock signal Clk1b is high and is supplied to the first node N1. In this embodiment, the high level voltage of the inverted first clock signal Clk1b is set to be the same as the voltage of the first power source VDD. Accordingly, the voltage of the first node N1 is stably maintained high even when the first transistor M1 and the second transistor M2 are simultaneously on.

When the voltage of the first signal is high and is applied to the first node N1, the fourth transistor M4 and the seventh transistor M7 are off. On the other hand, the fifth transistor M5 is off because of the voltage stored in the second capacitor C2 although the first clock signal Clk1 maintains the low level (the process of charging a voltage in the second capacitor C2 will be described later). Another embodiment is a voltage no less than VDD−(VSS+|V$_{th5}$|) is applied to the second capacitor C2. Therefore, the voltage of the first electrode of the fifth transistor M5 is set to be lower than the voltage of the first clock signal Clk1 so that the fifth transistor M5 is off.

Figure 5B:
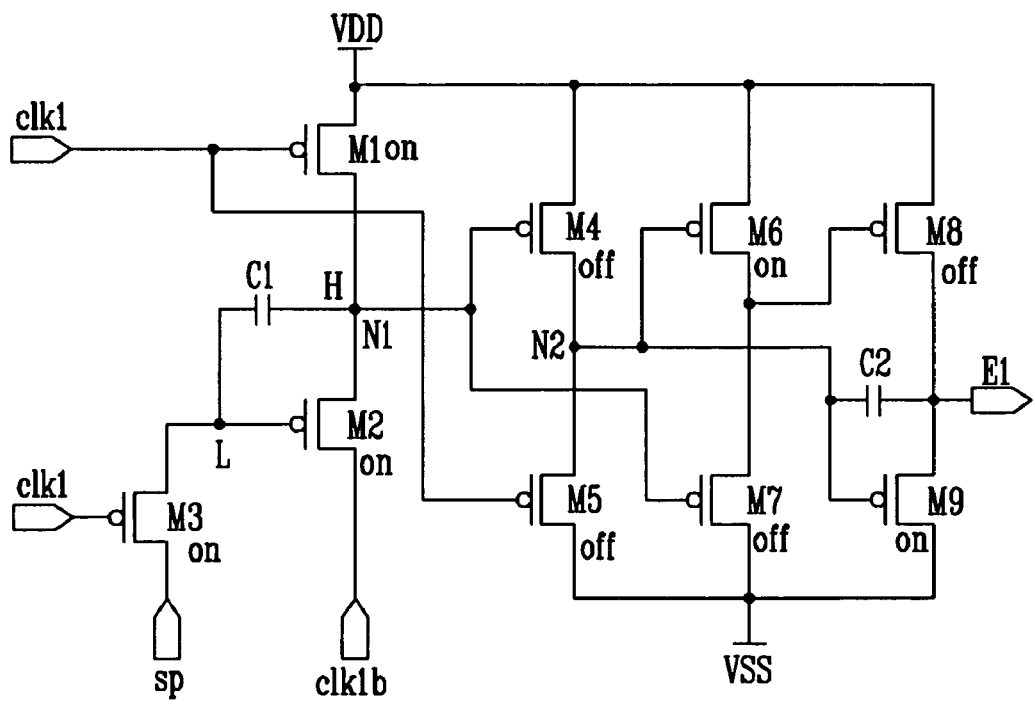

On the other hand, as illustrated in FIG. 5B, the sixth transistor M6 is turned on by the low voltage applied to the second node N2 (that is, the voltage stored in the second capacitor C2. When the sixth transistor M6 is turned on, the voltage of the first power source VDD is supplied to the gate electrode of the eighth transistor M8. Thus, the eighth transistor M8 is off.

The ninth transistor M9 is maintained on by the voltage stored in the second capacitor C2 such that the emission control line E is supplied with an output voltage of the second power source VSS. Since a voltage no less than VDD−(VSS+|V$_{th5}$|) is charged in the second capacitor C2, the voltage of the emission control line E is pulled down to the voltage of the second power source VSS.

Next, the first clock signal Clk1 is set to be in the high level and the inverted first clock signal Clk1b is set to be in the low level during a second period T2.

Figure 5C:
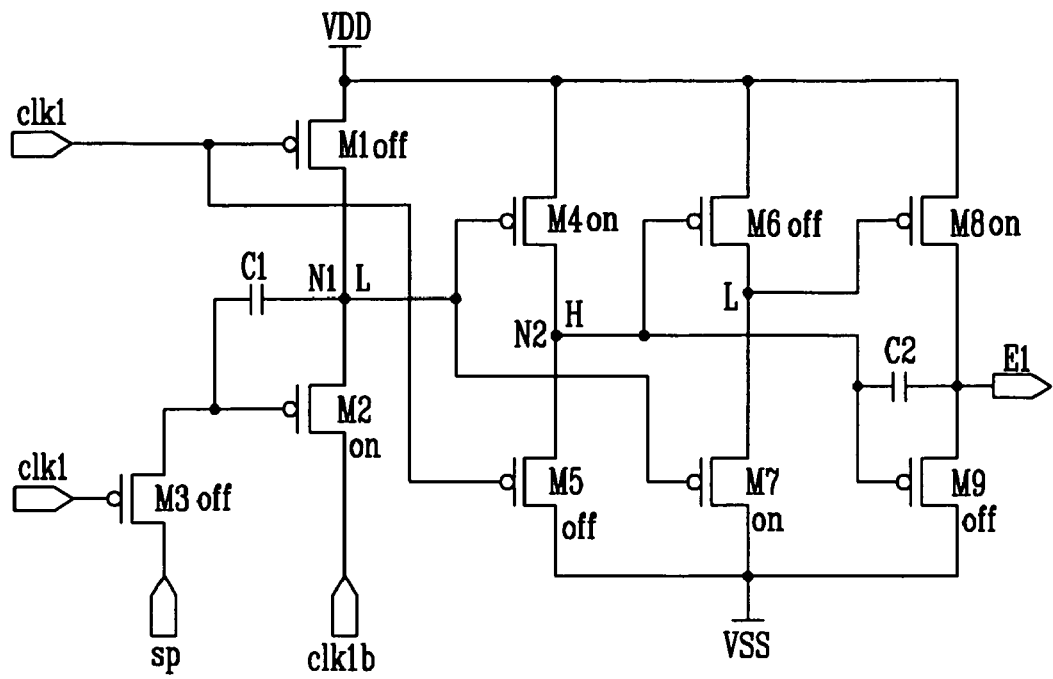

When the first clock signal Clk1 is set to be in the high level, as illustrated in FIG. 5C, the first transistor M1, the third transistor M3, and the fifth transistor M5 are turned off. The second transistor M2 is on because of the voltage stored in the first capacitor C1 during period T1. Because the second transistor M2 is on, the voltage level of the first node N1 becomes the level of the inverted first clock signal Clk1b (for example, the second power source VSS), that is, the low level.

When the voltage of the first signal (in the low level) is applied to the first node N1, the fourth transistor M4 and the seventh transistor M7 are turned on. When the fourth transistor M4 is turned on, the voltage level of the second node N2 becomes the voltage level of the first power source VDD. In response, the sixth transistor M6 and the ninth transistor M9 turn off. When the seventh transistor M7 is turned on, the voltage level of the gate electrode of the eighth transistor M8 becomes the voltage level of the second power source VSS so that the eighth transistor M8 is turned on. When the eighth transistor M8 is turned on, the voltage of the first power source VDD is supplied to the emission control line E. That is, the emission control signal goes high during the second period T2. Since the voltage of the first power source VDD is supplied to the both ends of the second capacitor C2 in the second period T2, the second capacitor C2 is substantially discharged.

Next, the first clock signal Clk1 is set to be in the low level and the inverted first clock signal Clk1b is set to be in the high level during a third period T3.

Figure 5D:
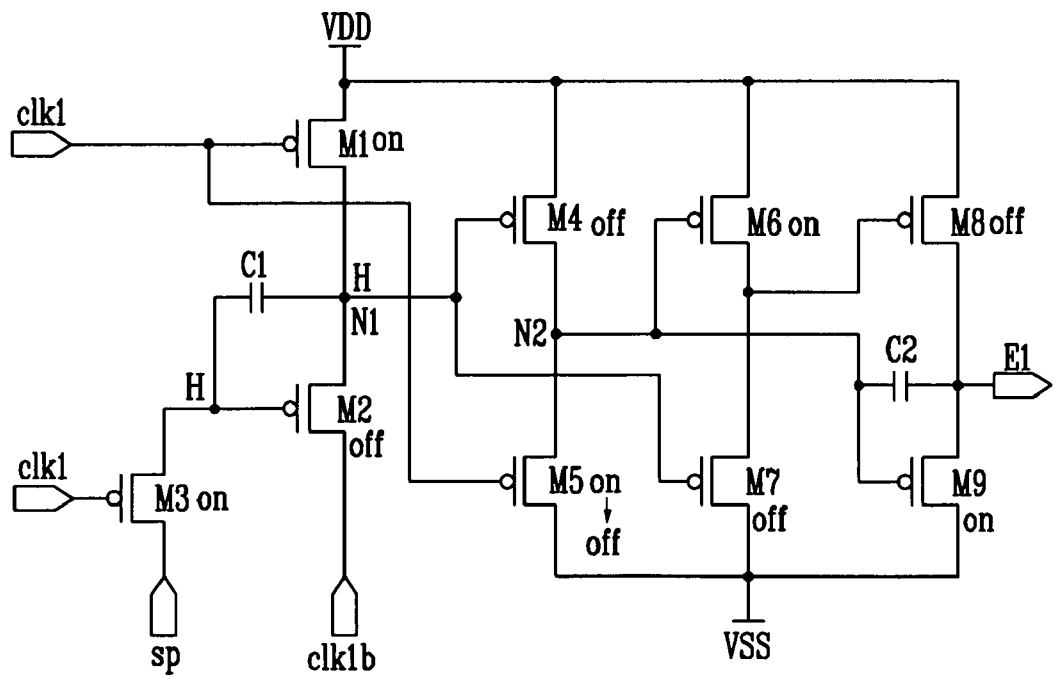

During the third period T3, as illustrated in FIG. 5D, the first transistor M1, the third transistor M3, and the fifth transistor M5 are turned on by the first clock signal Clk1. When the first transistor M1 is turned on, the voltage level of the first node N1 is becomes the voltage level of the first power source VDD. That is, the voltage of the first signal is high and is applied to the first node N1.

Because the third transistor M3 is turned on, the voltage of the start signal SP is supplied to the gate of the second transistor M2. Because the start signal SP has a high voltage (for example, the voltage of the first power source VDD) during the third period T3, the second transistor M2 is turned off. Since the voltage of both ends of the first capacitor C1 are the voltage of the first power source VDD, the first capacitor C1 is substantially discharged. Accordingly, the first capacitor C1 stores a voltage only when the start signal SP is low.

On the other hand, during the third period T3, the second transistor M2 is turned off, the high valued voltage of the first signal is applied to the first node N1, and the inverted first clock signal Clk1b is high. Therefore, although the first node N1 is high, because the second transistor M2 is off, current does not flow from the first node N1. This results in minimized power consumption.

On the other hand, when the fifth transistor M5 is turned on, the voltage of the second node N2 is pulled down to the voltage of VSS+|V$_{th5}$|(|V$_{th5}$| is the threshold voltage of the fifth transistor M5). After the voltage of the second node N2 is pulled down to the voltage of VSS+|V$_{th5}$|, the fifth transistor M5 is turned off. In response, the voltage no less than VDD−(VSS+|V$_{th5}$|) is stored in the second capacitor C2 due to the voltage of VSS+|V$_{th5}$| applied to the second node N2 and the first power source VDD applied to the emission control line E1.

The fourth transistor M4 and the seventh transistor M7 are turned off by the high voltage applied to the first node N1 and the sixth transistor M6 and the ninth transistor M9 are turned on by the voltage charged in the second capacitor C2.

When the sixth transistor M6 is turned on, the voltage of the first power source VDD is applied to the gate electrode of the eighth transistor M8 so that the eighth transistor M8 is turned off. When the ninth transistor M9 is turned on, the voltage level of the emission control line E1 that was high during the second period T2 becomes the voltage level of the second power source VSS. Because the voltage at the second node N2 is low, the second capacitor C2 is substantially discharged. Accordingly, the voltage of the emission control line E1 is pulled down to the voltage of the second power source VSS.

Accordingly, only the voltage of the first power source VDD is applied to the first node N1 until a low start signal SP is supplied again. That is, substantially no voltage is stored in the first capacitor C1 until a low start signal SP is supplied again. Accordingly, the second transistor M2 remains off. As a result, the voltage of the second power source VSS is supplied to the emission control line E1 while the ninth transistor M9 is maintained turned on by the voltage stored in the second capacitor C2.

As described above, since the inverted first clock signal Clk1b is high when the voltage of the first node N1 is high there is no current flowing through the second transistor M2 and thus, power consumption is reduced.

Thus, after a low start pulse, the emission control line E is supplied with a single pulse corresponding to the next pulse of first clock signal Clk1, as desired and as shown in FIG. 3.

Figure 6:
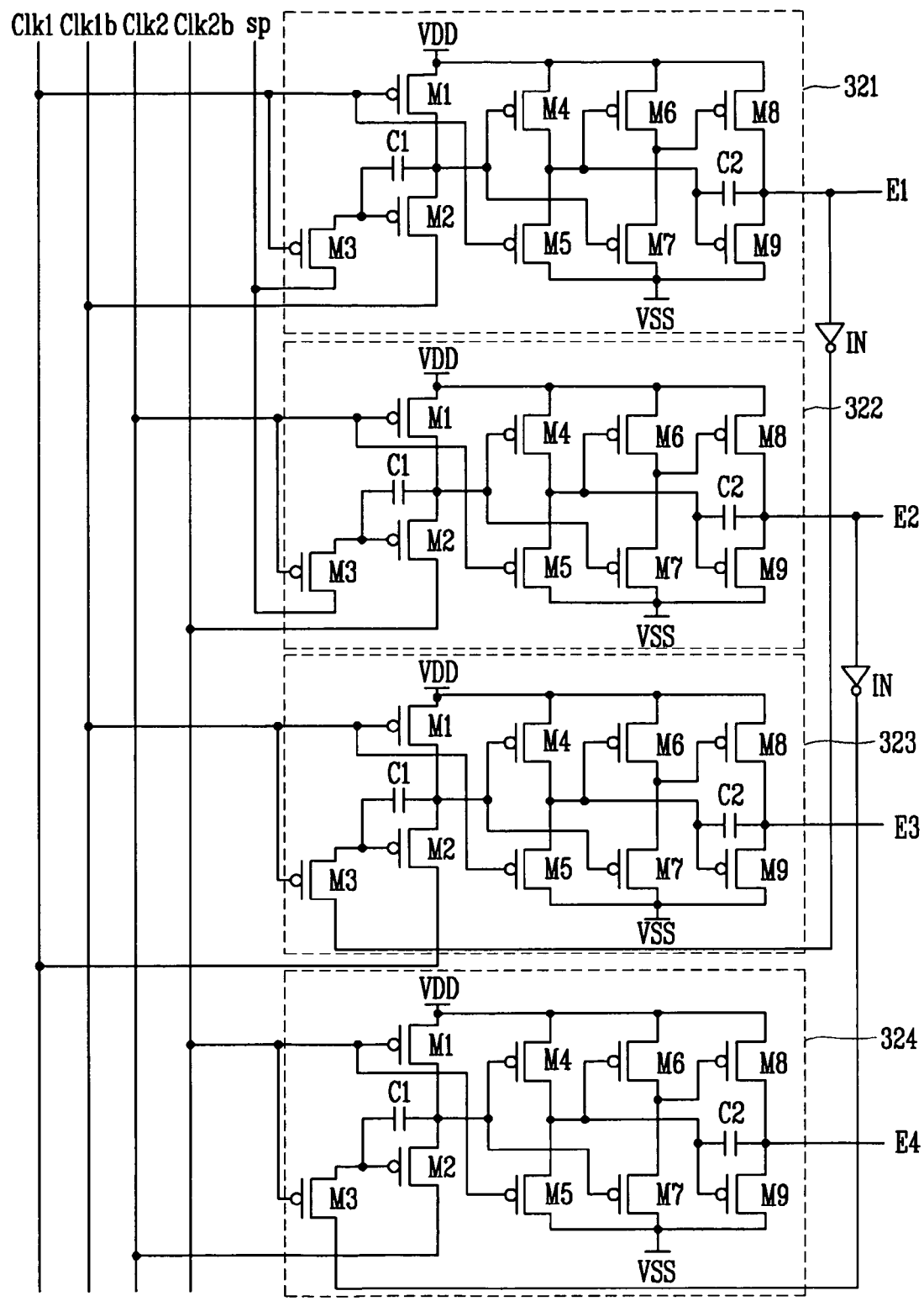
FIG. 6 illustrates circuits included in the first to fourth stages of the driver illustrated in FIG. 2.

FIG. 6 illustrates an embodiment of the first to fourth stages of an emission control line driver.

Referring to FIG. 6, as illustrated in FIGS. 4 to 5D, the first clock input and the second clock input of the first stage 321 receive the first clock signal Clk1 and the third clock input receives the inverted first clock signal Clk1b. The fourth input terminal receives the start signal SP.

On the other hand, the first clock input and the second clock input of the third stage 323 receive the inverted first clock signal Clk1b and the third clock input receives the first clock signal Clk1. The fourth input terminal receives the inverted output signal of the first stage 321 via the inverter IN1.

The first clock input and the second clock input of the second stage 322 receive the second clock signal Clk2 and the third clock input receives the inverted second clock signal Clk2b. The fourth input terminal receives the start signal SP.

On the other hand, the first clock input and the second clock input of the fourth stage 324 receive the inverted second clock signal Clk2b and the third clock input receives the second clock signal Clk2. The fourth input terminal receives the inverted output signal of the second stage 322 via the inverter IN2.

Operation will be described with reference to FIG. 3. First, the first stage 321 stores a voltage in the first capacitor C1 in response to the low start signal SP supplied in the first period T1 and supplies a high emission control signal to the first emission control line E1 in the second period T2 using the stored voltage. The third stage 323 stores a voltage in its first capacitor C1 according to the inverted first emission control signal supplied in the second period T2 and supplies a high emission control signal to the third emission control line E3 in the third period T3 using the stored voltage. Accordingly, the inverted first emission control signal becomes a start signal for the third stage 323.

Similarly, the second stage 322 stores a voltage in its first capacitor C1 in response to the low start signal SP supplied in the second half of the first period T1 and the first half of the second period T2 (the low start signal SP is supplied to overlap the low period of the first clock signal Clk1 and the low period of the second clock signal Clk2) and supplies a high emission control signal to the second emission control line E2 in the second half of the second period T2 and the first half of the third period T3 using the stored voltage. Therefore, the high emission control signal supplied to the second emission control line E2 partially overlaps the high emission control signals supplied to each of the first emission control line E1 and the third emission control line E3.

The fourth stage 324 receives the inverted emission control signal supplied to the second emission control line E2 via the inverter IN2 and stores a voltage in its first capacitor C1. Thus, the inverted second emission control signal becomes a start signal for the fourth stage 324. The fourth stage 324 supplies a high emission control signal to the fourth emission control line E4 in the second half of the third period T3 and the first half of a fourth period T4 using the voltage stored in its first capacitor C1. The emission control line driver 30 according to the embodiments described above uses PMOS transistors, although NMOS and CMOS configurations are also possible. When PMOS transistors are exclusively used, the emission control line driver can be mounted on a panel. When the emission control line driver 30 is mounted on the panel, it is possible to reduce the size, weight, and manufacturing cost of the panel. Also, because the emission control line driver 30 generates an emission control signal every ¼ period of each clock signal, the emission control line driver 30 can produce emission control signals for use in high speed pixel arrays.

Figure 7:
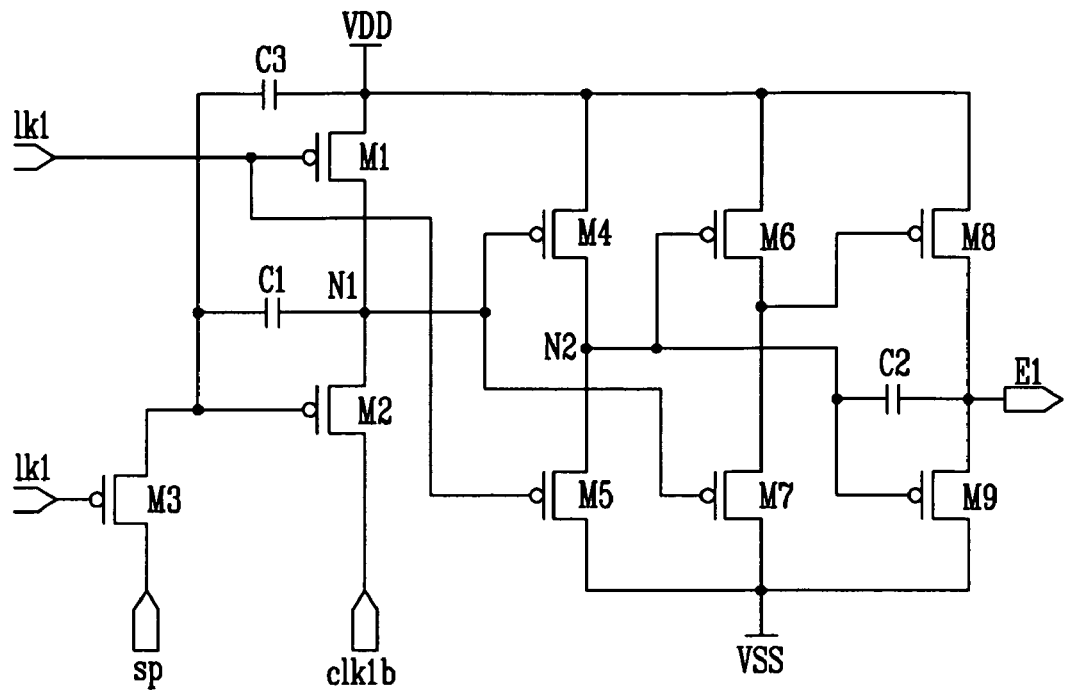
FIG. 7 is a circuit diagram of another embodiment of the stage illustrated in FIG. 2.

FIG. 7 illustrates a circuit feature included in each stage according to some embodiments. For convenience, the structure of the first stage 321 of FIG. 7 substantially identical to the structure of the stage illustrated in FIG. 4 will be omitted.

Referring to FIG. 7, the stage 321 with this circuit feature further include a third capacitor C3 provided between the first power source VDD and one end of the storage capacitor C1 (the terminal connected to the gate electrode of the second transistor M2).

When the first clock signal Clk1 is in the high level, the third transistor M3 is turned off. As a result, one end of the first capacitor C1 floats. The voltage of the gate electrode of the second transistor M2 may change according to the parasitic capacitor such as Cgs and Cgd of the second transistor M2 in response to a change in voltage at the first node N1. The third capacitor C3 is provided between the first power source VDD that maintains a uniform voltage and one end of the first capacitor C1 to reduce the change in the voltage of the gate electrode of the second transistor M2.

Figure 8:
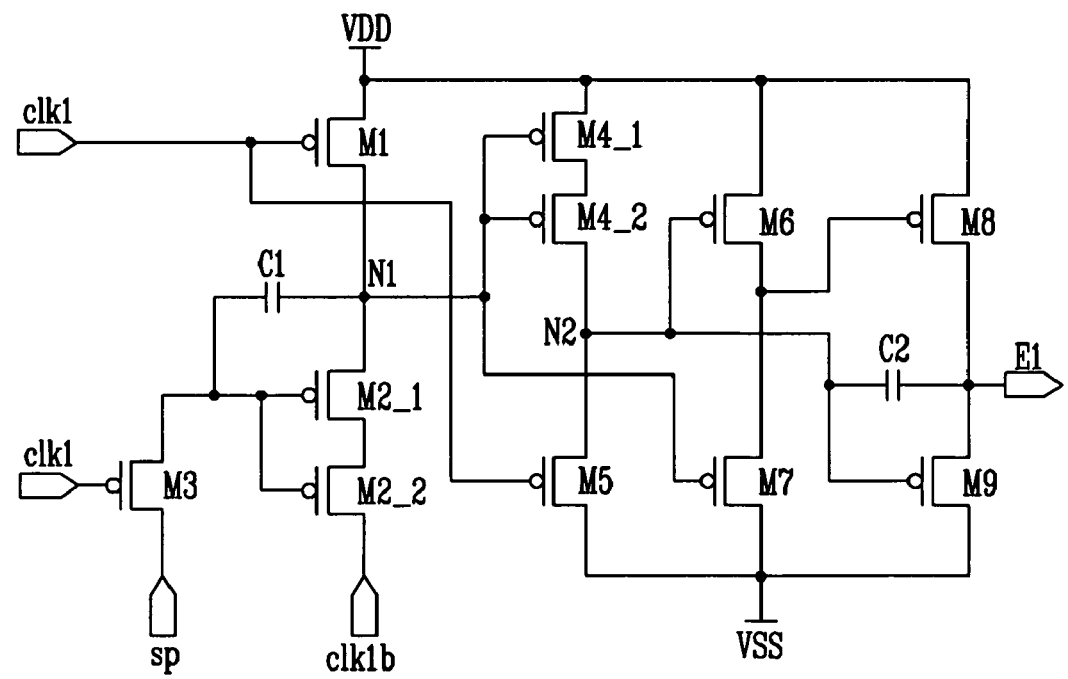
FIG. 8 is a circuit diagram of the stage illustrated in FIG. 2.

FIG. 8 illustrates a circuit feature included in each stage according to some embodiments. For convenience sake, the discussion of structure of the stage of FIG. 8 which is substantially identical to the structure of the stage illustrated in FIG. 4 will be omitted.

Referring to FIG. 8, in the stage according to the circuit with this feature, the second transistor that receives the inverted clock signal Clk1b is formed as dual gates M2_1 and M2_2. Similarly, the fourth transistor formed between the second node N2 and the first power source VDD may be formed as dual gates M4_1 and M4_2.

Figure 9:
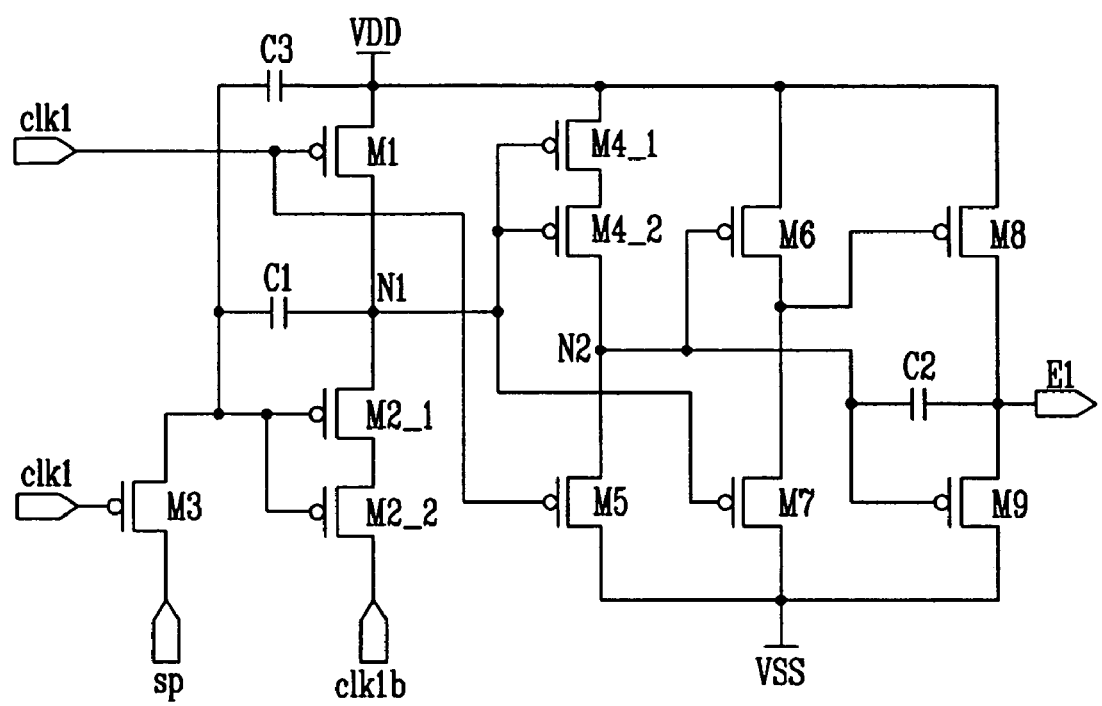
FIG. 9 is a circuit diagram of the stage illustrated in FIG. 2.

In embodiments where the second transistor M2_1 and M2_2 is formed as dual gates, when the inverted clock signal Clk1b is supplied, a lower voltage change will occur on the gate of the second transistor M2_1 and M2_2 than if a second transistor were formed as a single gate. This occurs because only the gate capacitance of the second transistor M2_2 injects charge onto the gate of the second transistor M2_1 and M2, and the gate capacitance of the second transistor M2_2 is added to the capacitance of the first capacitor C1 to stabilize the gate voltage. When the fourth transistor M4_1 and M4_2 is formed as dual gates, although the second node N2 maintains a low voltage, the amount of leakage current that flows from the first power source VDD to the second node N2 via the fourth transistor M4 is reduced, and power consumption is accordingly reduced. As shown in FIG. 8, two transistors are serially formed in each of the second transistor and the fourth transistor. However, two or more transistors (for example, four transistors) may be serially formed to further enhance the performance of each of the second transistor and the fourth transistor for reasons analogous to those discussed above. In the circuit according to some embodiments, as illustrated in FIG. 9, the third capacitor C3 may be formed between one terminal of the first capacitor C1 and the first power source VDD, and one or more of the second transistor M2 and the fourth transistor M4 may be formed as two or more gates.

As described above, according to the emission control line driver of the embodiments described herein, and an organic light emitting display using the emission control line driver, since all of the transistors included in the emission control line driver are realized as PMOS, the emission control line driver can be mounted on the panel so that it is possible to reduce the size, weight, and manufacturing cost of the panel. Also, because the emission control line driver according to embodiments described herein generates an emission control signal every ¼ period of each clock signal, the emission control line driver can be used to drive high speed displays.

Because the stage circuits included in the emission control line driver according to embodiments described herein have active pull up and active pull down output stages, high speed stable driving is achieved. Also, since the stage circuits included in the emission control line driver according to embodiments described herein minimize static current, power consumption is reduced.

Although a few embodiments of the invention have been shown and described, it will be appreciated by those skilled in the art that changes might be made in these embodiments without departing from the principles and spirit of the invention.

What is claimed is:

1. An emission control line driver configured to receive first and second clock signals and inverted first and inverted second clock signals, the emission control line driver comprising:
a plurality of stages, each stage configured to receive one of the first and second clock signals and one of an inverted first clock signal and an inverted second clock signal, wherein each stage comprises first and second output transistors, wherein the first and second output transistors are electrically connected to an output of the stage and are connected to first and second power supplies, respectively, wherein the plurality of stages comprises:
a first stage comprising first and second clock inputs, the first and second clock inputs configured to receive the first clock signal, and a third clock input, the third clock input configured to receive the inverted first clock signal;
a second stage comprising fourth and fifth clock inputs, the fourth and fifth clock inputs configured to receive the second clock signal, and a sixth clock input, the sixth clock input configured to receive the inverted second clock signal;
a third stage comprising seventh and eighth clock inputs, the seventh and eighth clock inputs configured to receive the inverted first clock signal, and a ninth clock input, the ninth clock input configured to receive the first clock signal; and
a fourth stage comprising tenth and eleventh clock inputs, the tenth and eleventh clock inputs configured to receive the inverted second clock signal, and a twelfth clock input, the twelfth clock input configured to receive the second clock signal,
wherein each of the first, second, third, and fourth stages comprises:
an input unit, the input unit configured to supply a first signal to a first node, and
an output unit configured to output an emission control signal corresponding to the first signal, and
wherein the input unit comprises:
a first transistor, the first transistor electrically connected between a first power source and the first node, wherein the gate electrode of the first transistor is electrically connected to one of the first clock input, fourth clock input, seventh clock input and tenth clock input,
a second transistor, the second transistor electrically connected to the first node and electrically connected to one of the third clock input, sixth clock input, ninth clock input and twelfth clock input,
a first capacitor, the first capacitor electrically connected between a gate electrode of the second transistor and the first node, and
a third transistor, the third transistor electrically connected to the gate electrode of the second transistor by a conductor contacting both the third transistor and the gate electrode of the second transistor, and electrically connected to one of the second clock input, fifth clock input, eighth clock input and eleventh clock input, wherein the third transistor is configured to receive a start signal and to transmit the start signal to the second transistor,
wherein the clock input electrically connected to the gate electrode of the first transistor is electrically connected to the clock input electrically connected to the third transistor, wherein the first transistor is configured to selectively electrically connect the first node to the first power source according to the clock signal of the clock input electrically connected to the gate electrode of the first transistor.

2. The emission control line driver of claim 1, wherein the first stage further comprises a thirteenth input, the thirteenth input configured to receive a first start signal, and the second stage further comprises a fourteenth input, the fourteenth input configured to receive the first start signal.

3. The emission control line driver of claim 1, wherein the third stage further comprise a fifteenth input, the fifteenth input configured to receive a second start signal, the second start signal generated by the first stage, and the fourth stage further comprises a sixteenth input, the sixteenth input configured to receive a third start signal, the third start signal generated by the second stage.

4. The emission control line driver of claim 3, wherein the fifteenth input is configured to receive the second start signal via a first inverter, and the sixteenth input is configured to receive the third start signal via a second inverter.

5. The emission control line driver of claim 4, further comprising:
a fifth stage comprising seventeenth and eighteenth clock inputs, the seventeenth and eighteenth clock inputs configured to receive the first clock signal;
a nineteenth clock input, the nineteenth clock input configured to receive an inverted first clock signal; and
a twentieth input, the twentieth input configured to receive a fourth start signal generated by the third stage.

6. The emission control line driver of claim 5, wherein the twentieth input is configured to receive the fourth start signal via a third inverter.

7. The emission control line driver of claim 1, wherein the first capacitor is configured to store a voltage when the second transistor receives a low start signal and to substantially discharge when the second transistor receives a high start signal.

8. The emission control line driver of claim 7, wherein the second transistor is configured to turn on when the voltage is stored in the first capacitor such that the first signal is low, and the second transistor is configured to turn off when the capacitor is substantially discharged such that the first signal is high.

9. The emission control line driver of claim 1, wherein the output unit comprises:
a fourth transistor, a sixth transistor, and an eighth transistor, each electrically connected to the first power source;
a fifth transistor, the fifth transistor formed between a second power source and the fourth transistor, the second power source configured to have a lower voltage than the first power source;
a seventh transistor formed between the second power source and the sixth transistor;
a ninth transistor formed between the second power source and the eighth transistor; and
a second capacitor formed between the gate electrode and a first electrode of the ninth transistor.

10. The emission control line driver of claim 9,
wherein the gate electrodes of the fourth and seventh transistors are electrically connected to the first node, and wherein the gate electrodes of the sixth transistor and the ninth transistor are electrically connected to a second node, wherein the second node is electrically connected to the fourth and fifth transistors.

11. The emission control line driver of claim 10, wherein the second capacitor is configured to store a voltage of a first value after an emission control signal is supplied to the emission control line electrically connected thereto, the first value being higher than a second value, the second value obtained by subtracting the second power source and the threshold voltage of the fifth transistor from the supply value of the voltage of the first power source.

12. The emission control line driver of claim 11, wherein after the voltage is stored the fourth and fifth transistors are configured to substantially turn off such that one terminal of the second capacitor substantially floats, and wherein the stored voltage substantially persists on the capacitor.

13. The emission control line driver of claim 9, wherein the gate electrode of the eighth transistor is electrically connected to a second electrode of the sixth transistor.

14. The emission control line driver of claim 1, wherein the emission control line driver is configured to receive the first and second clock signals arranged so as to be of substantially the same period, and so as to be about 90 degrees out of phase.

15. An organic light emitting display comprising
a pixel portion comprising a plurality of pixels electrically connected to a plurality of emission control lines, a plurality of scan lines, and a plurality of data lines,
a scan driver configured to drive the scan lines;
a data driver configured to drive the data lines; and
an emission control line driver configured to supply emission control signals to the emission control lines, wherein the emission control line driver comprises:
a first stage comprising first and second clock inputs, the first and second clock inputs configured to receive a first clock signal, and a third clock input, the third clock input configured to receive an inverted first clock signal;
a second stage comprising fourth and fifth clock inputs, the fourth and fifth clock inputs configured to receive a second clock signal, and a sixth clock input, the sixth clock input configured to receive an inverted second clock signal;
a third stage comprising seventh and eighth clock inputs, the seventh and eighth clock inputs configured to receive the inverted first clock signal, and a ninth clock input, the ninth clock input configured to receive the first clock signal; and
a fourth stage comprising tenth and eleventh clock inputs, the tenth and eleventh clock inputs configured to receive the inverted second clock signal, and a twelfth clock input, the twelfth clock input configured to receive the second clock signal,
wherein each of the first, second, third, and fourth stages comprises:
first and second output transistors, wherein the first and second output transistors are electrically connected to an output of the stage and are connected to first and second power supplies, respectively,
an input unit, the input unit configured to supply a first signal to a first node, and
an output unit configured to output an emission control signal corresponding to the first signal, and
wherein the input unit comprises:
a first transistor, the first transistor electrically connected between a first power source and the first node, wherein the gate electrode of the first transistor is electrically connected to one of the first clock input, fourth clock input, seventh clock input and tenth clock input,
a second transistor, the second transistor electrically connected to the first node and electrically connected to one of the third clock input, sixth clock input, ninth clock input and twelfth clock input,
a first capacitor, the first capacitor electrically connected between a gate electrode of the second transistor and the first node, and
a third transistor, the third transistor electrically connected to the gate electrode of the second transistor by a conductor contacting both the third transistor and the gate electrode of the second transistor, and electrically connected to one of the second clock input, fifth clock input, eighth clock input and eleventh clock input, wherein the third transistor is configured to receive a start signal and to transmit the start signal to the second transistor,
wherein the clock input electrically connected to the gate electrode of the first transistor is electrically connected to the clock input electrically connected to the third transistor, wherein the first transistor is configured to selectively electrically connect the first node to the first power source according to the clock signal of the clock input electrically connected to the gate electrode of the first transistor.

16. The organic light emitting display as claimed in claim 15, wherein the output unit comprises:
a fourth transistor, a sixth transistor, and an eighth transistor, each electrically connected to the first power source;
a fifth transistor, the fifth transistor formed between a second power source and the fourth transistor, the second power source configured to have a lower voltage than the first power source;
a seventh transistor formed between the second power source and the sixth transistor;
a ninth transistor formed between the second power source and the eighth transistor; and
a second capacitor formed between the gate electrode and a first electrode of the ninth transistor.

17. A control signal driving circuit configured to provide a control signal pulse substantially aligned with a clock input signal, wherein the control signal pulse is provided in response to a start pulse input signal, the circuit comprising:
a capacitor;
first and second output transistors, wherein the capacitor and the first and second output transistors are electrically connected to an output and the first and second output transistors are electrically connected to first and second power supplies, respectively;
an input unit, the input unit configured to supply a first signal to a first node, and
an output unit configured to output an emission control signal corresponding to the first signal,
wherein the input unit comprises:
a first transistor, the first transistor electrically connected between a first power source and the first node, wherein the gate electrode of the first transistor is electrically connected to one of the first clock input, fourth clock input, seventh clock input and tenth clock input,
a second transistor, the second transistor electrically connected to the first node and electrically connected to one of the third clock input, sixth clock input, ninth clock input and twelfth clock input,
a first capacitor, the first capacitor electrically connected between a gate electrode of the second transistor and the first node, and a third transistor, the third transistor electrically connected to the gate electrode of the second transistor, by a conductor contacting both the third transistor and the gate electrode of the second transistor, and electrically connected to one of the second clock input, fifth clock input, eighth clock input and eleventh clock input, wherein the third transistor is configured to receive a start signal and to transmit the start signal to the second transistor, wherein the clock input electrically connected to the gate electrode of the first transistor is electrically connected to the clock input electrically connected to the third transistor, wherein the first transistor is configured to selectively electrically connect the first node to the first power source according to the clock signal of the clock input electrically connected to the gate electrode of the first transistor.

18. The circuit of claim 17, further compromising:

an input unit configured to provide a single pulse substantially aligned with the clock input signal, wherein the single pulse is provided in response to a start pulse input signal; and an output unit configured to provide the control signal pulse, wherein the control signal pulse is an inverted version of the single pulse.

19. The circuit of claim 17, wherein the input unit comprises no more than three transistors.

20. The circuit of claim 17, wherein the output unit comprises no more than six transistors.

21. A control signal driving circuit configured to provide a control signal pulse substantially aligned with a clock input signal, wherein the control signal pulse is provided in response to a start pulse input signal, the circuit comprising:

means for generating a single pulse substantially aligned with the clock input signal, wherein the single pulse is provided in response to a start pulse input signal; and means for generating the control signal pulse, wherein the control signal pulse is an inverted version of the single pulse, the generating means being electrically connected to first and second power supplies, wherein each of the means for generating the single pulse comprises:

an input unit, the input unit configured to supply a first signal to a first node, and an output unit configured to output an emission control signal corresponding to the first signal, and wherein the input unit comprises:

a first transistor, the first transistor electrically connected between a first power source and the first node, wherein the gate electrode of the first transistor is electrically connected to one of the first clock input, fourth clock input, seventh clock input and tenth clock input, a second transistor, the second transistor electrically connected to the first node and electrically connected to one of the third clock input, sixth clock input, ninth clock input and twelfth clock input, a first capacitor, the first capacitor electrically connected between a gate electrode of the second transistor and the first node, and a third transistor, the third transistor electrically connected to the gate electrode of the second transistor by a conductor contacting both the third transistor and the gate electrode of the second transistor, and electrically connected to one of the second clock input, fifth clock input, eighth clock input and eleventh clock input, wherein the third transistor is configured to receive a start signal and to transmit the start signal to the second transistor, wherein the clock input electrically connected to the gate electrode of the first transistor is electrically connected to the clock input electrically connected to the third transistor, wherein the first transistor is configured to selectively electrically connect the first node to the first power source according to the clock signal of the clock input electrically connected to the gate electrode of the first transistor.

22. The circuit of claim 21, wherein the means for generating a single pulse comprises no more than three transistors.

23. The circuit of claim 21, wherein the means for generating the control signal pulse comprises no more than six transistors.

24. The circuit of claim 21, comprising transistors of only PMOS conductivity type.

25. The circuit of claim 21, comprising transistors of only NMOS conductivity type.

* * * * *